(12) United States Patent
Jeong et al.

(10) Patent No.: US 8,466,746 B2
(45) Date of Patent: Jun. 18, 2013

(54) THREE-STAGE GAN HEMT DOHERTY POWER AMPLIFIER FOR HIGH FREQUENCY APPLICATIONS

(75) Inventors: Yoon Ha Jeong, Pohang-si (KR); Mun Woo Lee, Daegu-si (KR); Sang Ho Kam, Gimhae-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 34 days.

(21) Appl. No.: 13/345,163

(22) Filed: Jan. 6, 2012

(65) Prior Publication Data

US 2012/0218044 A1 Aug. 30, 2012

(30) Foreign Application Priority Data

Feb. 24, 2011 (KR) ........................ 10-2011-0016645

(51) Int. Cl.
*H03F 3/68* (2006.01)
(52) U.S. Cl.
USPC ...................................... 330/295; 330/124 R
(58) Field of Classification Search
USPC ................................ 330/295, 124 R, 126, 84
See application file for complete search history.

(56) References Cited

U.S. PATENT DOCUMENTS

| | | | |
|---|---|---|---|
| 7,071,775 B2 * | 7/2006 | Gailus et al. | 330/124 R |
| 8,035,444 B2 * | 10/2011 | Okubo et al. | 330/124 R |
| 8,274,332 B2 * | 9/2012 | Cho et al. | 330/295 |
| 8,400,216 B2 * | 3/2013 | Jeong et al. | 330/124 R |
| 2003/0141933 A1 | 7/2003 | Pengelly | |
| 2004/0189380 A1 | 9/2004 | Myer et al. | |
| 2010/0117726 A1 | 5/2010 | Okubo et al. | |

FOREIGN PATENT DOCUMENTS

EP 1677414 7/2006

OTHER PUBLICATIONS

Kim, I., et al., "Optimized Design of a Highly Efficient Three-Stage Doherty PA Using Gate Adaptation", IEEE Transactions on Microwave Theory and Techniques, vol. 58, No. 10, Oct. 2010, pp. 2562-2574, IEEE.

Lee, Y-S, et al., "Highly Linear and Efficient Asymmetrical Doherty Power Amplifiers with Adaptively Bias-controlled Predistortion Drivers", IMS 2009, pp. 1393-1396, IEEE.

Ildu Kim et al., "A 2.655 GHz 3 -stage Doherty Power Amplifier using Envelope Tracking Technique", Dept. of Electrical Engineering, Pohang University of Science and Technology, pp. 1496-1499, 2010 IEEE.

Yong-Sub Lee et al., "Advanced Design of a Double Doherty Power Amplifier with a Flat Efficiency Range"; Department of Electrical Engineering, Pohang University of Science and Technology; pp. 1500-1503, 2010 IEEE.

Junghwan Moon et al.; "Highly Efficient Three-Way Saturated Doherty Amplifier with Digital Feedback Predistortion" OEEE Microwave and Wireless Components Letters, vol. 18, No. 8, Aug. 2008.

Jangheon Kim et al., "Optimum Operation of Asymmetrical-Cells-Based Linear Doherty Power Amplifiers—Uneven Power Drive and Power Matching", IEEE Transactions on Microwave Theory and Techniques, vol. 53, No. 5, May 2005.

* cited by examiner

*Primary Examiner* — Henry Choe
(74) *Attorney, Agent, or Firm* — Kile Park Reed & Houtteman PLLC

(57) ABSTRACT

A three-stage GaN HEMT Doherty power amplifier for high frequency applications includes: a carrier amplifier; first and second peaking amplifier; a 10-dB power divider configured to divide an input signal to the carrier amplifier and the first and second peaking amplifiers; a first path for controlling input power of the carrier amplifier; and a second path for maintaining an efficiency of 40% or more in an output range of 40 dBm to 50 dBm.

11 Claims, 7 Drawing Sheets

THREE-STAGE GAN HEMT DOHERTY POWER AMPLIFIER FOR HIGH FREQUENCY APPLICATIONS

BACKGROUND OF THE INVENTION

1. Field of the Invention

The present invention relates to a Doherty power amplifier operating at 3 GHz or more, and more particularly, to a three-stage GaN HEMT (High Electron Mobility Transistor) Doherty power amplifier for high frequency applications, which is capable of implementing high efficiency in a wide range using a GaN HEMT.

2. Description of the Related Art

As well known to those skilled in the art, the efficiency of a power amplifier used in a base station or repeater decides the efficiency of the entire system. Therefore, it is important to raise the efficiency of the power amplifier. As one of methods for raising the efficiency of the power amplifier, a Doherty power amplifier may be applied. The Doherty power amplifier has high efficiency at a 6 dB back-off power (BOP) level from the saturation output power, unlike the other methods for raising the efficiency.

A WCMDA (Wideband Code Division Multiple Access) signal or WiMAX (Worldwide Interoperability for Microwave Access) signal, which has been recently used frequently, has a large peak-to-average power ratio (PAPR). Therefore, in order to secure linearity, the WCMDA signal and the WiMAX signal are used at an output power corresponding to a BOP level to which the PAPR is reflected. Therefore, since the Doherty power amplifier has high efficiency in a wide output range, the Doherty power amplifier may be applied to a base station or repeater. In particular, much research has been recently conducted on an N-stage Doherty power amplifier having high efficiency at the 6 dB BOP level or more.

When the Doherty power amplifier is designed, Si LDMOSFETs which are inexpensive and exhibit stable performance are usually used as active elements of the power amplifier. However, when a power amplifier operating at 3 GHz is designed, Si LDMOSFET cannot be used because it has low saturation velocity. However, a GaN MEMT exhibits high efficiency even at 3 GHz, because it has high saturation velocity.

FIG. 1 is a circuit diagram of a conventional three-stage Doherty power amplifier.

Referring to FIG. 1, an input signal is divided into inputs of a carrier amplifier 104, a first peaking amplifier 105, and a second peaking amplifier 106 through a three-wavy power divider 101. An input matching circuit 103 and an output matching circuit 107 optimize gains and efficiencies of the respective power amplifiers. Depending on the magnitude of the input signal, impedance of the carrier amplifier 104 is increased by λ/4 transmission lines 108 and 109. Thus, the carrier amplifier 104 may exhibit high efficiency even at a low input. In order to compensate for phase differences between the carrier amplifier 104 and the first and second peaking amplifiers 105 and 106 caused by the λ/4 transmission lines 108 and 109, a λ/4 transmission line 102 and a λ/2 transmission line 102 are inserted into the inputs of the first peaking amplifier 105 and the second peaking amplifier 106, respectively. Since the three-stage Doherty power amplifier uses the three-way power divider at the input thereof, the gain of the carrier amplifier decreases.

FIG. 2 is graph showing drain currents of the carrier amplifier 104, the first peaking amplifier 105, and the second peaking amplifier 106 in the conventional three-stage Doherty power amplifier of FIG. 1.

Referring to FIG. 2, the drain current of the carrier amplifier 104 increases in proportional to the input magnitude, and the carrier amplifier 104 is then saturated to maintain a constant current, when the second peaking amplifier 105 starts to operate. The first and second peaking amplifiers 105 and 106 start to operate at different time points, depending on the capacities of elements used in the carrier amplifier 104 and the first and second peaking amplifiers 105 and 106. The three-stage Doherty power amplifier has high efficiency at the time points where the first and second peaking amplifiers 105 and 106 respectively operate. When a GaN HEMT is used as the carrier amplifier 104, the following problem may occur: when high input power is applied after the GaN HEMT is saturated, a current may flow in the gate of the GaN HEMT, thereby causing a breakdown.

The above-described conventional three-stage power amplifier exhibits high efficiency at a large BOP level. A power amplifier operating at a frequency of 3 GHz should use a GaN HEMT. However, when the magnitude of an input signal increases after output power of the carrier amplifier is saturated, a current of dozens mA or more flows in the gate of the carrier amplifier such that the amplifier cannot endure a large input magnitude. Then, it is impossible to design the three-stage Doherty power amplifier.

SUMMARY OF THE INVENTION

Accordingly, the present invention has been made in an effort to solve the problems occurring in the related art, and an object of the present invention is to provide a three-stage Doherty power amplifier which is capable of operating at a high frequency of 3 GHz using a GaN HEMT.

In order to achieve the above object, according to one aspect of the present invention, there is provided a three-stage GaN HEMT Doherty power amplifier for high frequency applications, including: a carrier amplifier; first and second peaking amplifier; a 10-dB power divider configured to divide an input signal to the carrier amplifier and the first and second peaking amplifiers; a first path for controlling input power of the carrier amplifier; and a second path for maintaining an efficiency of 40% or more in an output range of 40 dBm to 50 dBm.

The first path may include a driving amplifier configured to control the carrier amplifier according to the magnitude of the input signal; and a gate bias controller configured to amplify a voltage of several hundreds mV.

The first path may include the carrier amplifier, and the carrier amplifier may include a GaN HEMT.

The second path may include a λ/4 transmission line in front of a delay line, in order to compensate for a λ/4 transmission line at an output of the carrier amplifier; and a hybrid 3-dB power divider configured to apply inputs having the same magnitude and a phase difference of 90 degrees to the first and second peaking amplifiers.

The second path may include the first and peaking amplifiers, and the first and second peaking amplifiers may include a GaN HEMT.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
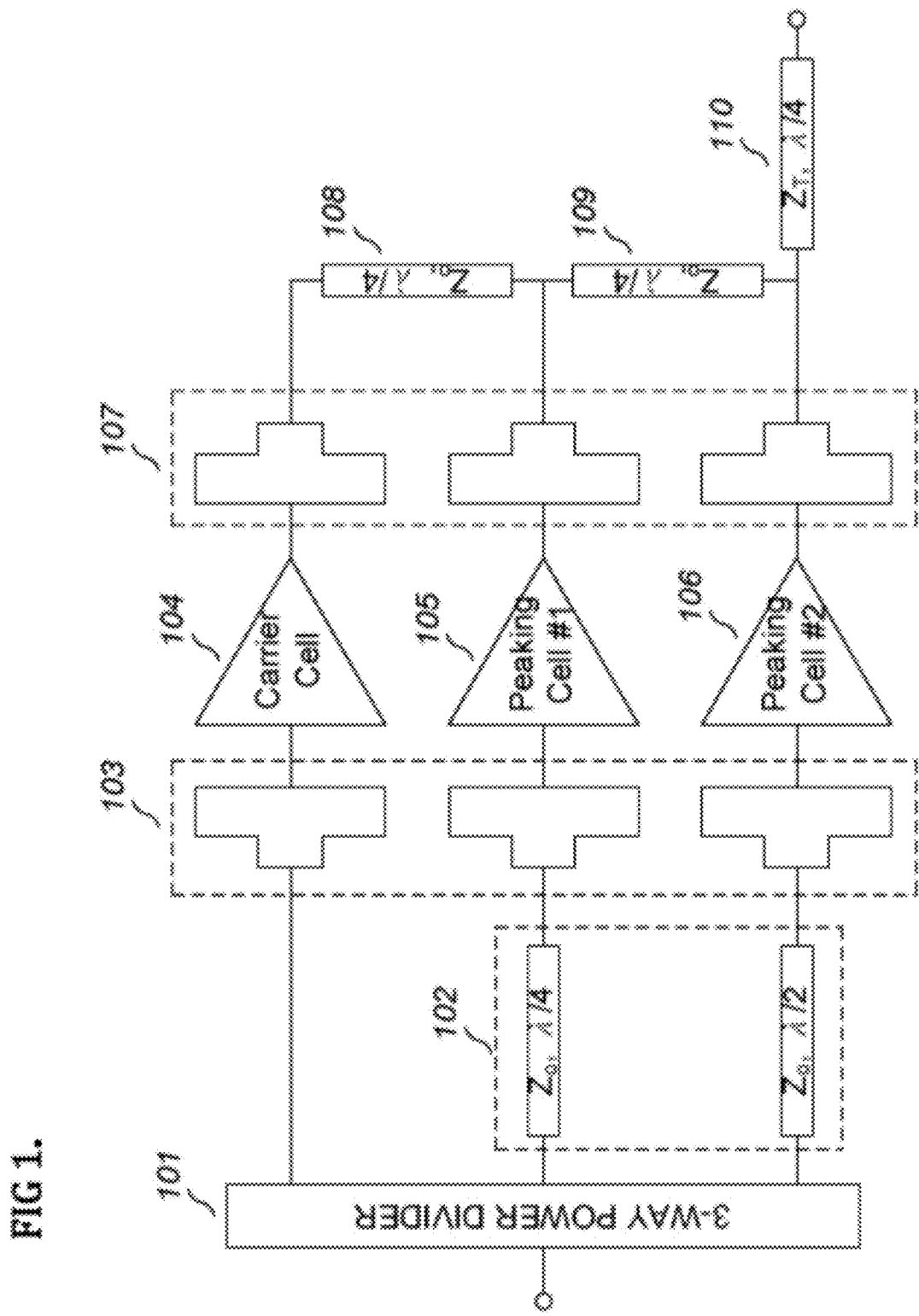
FIG. 1 is a circuit diagram of a conventional three-stage Doherty power amplifier.
Figure 2:
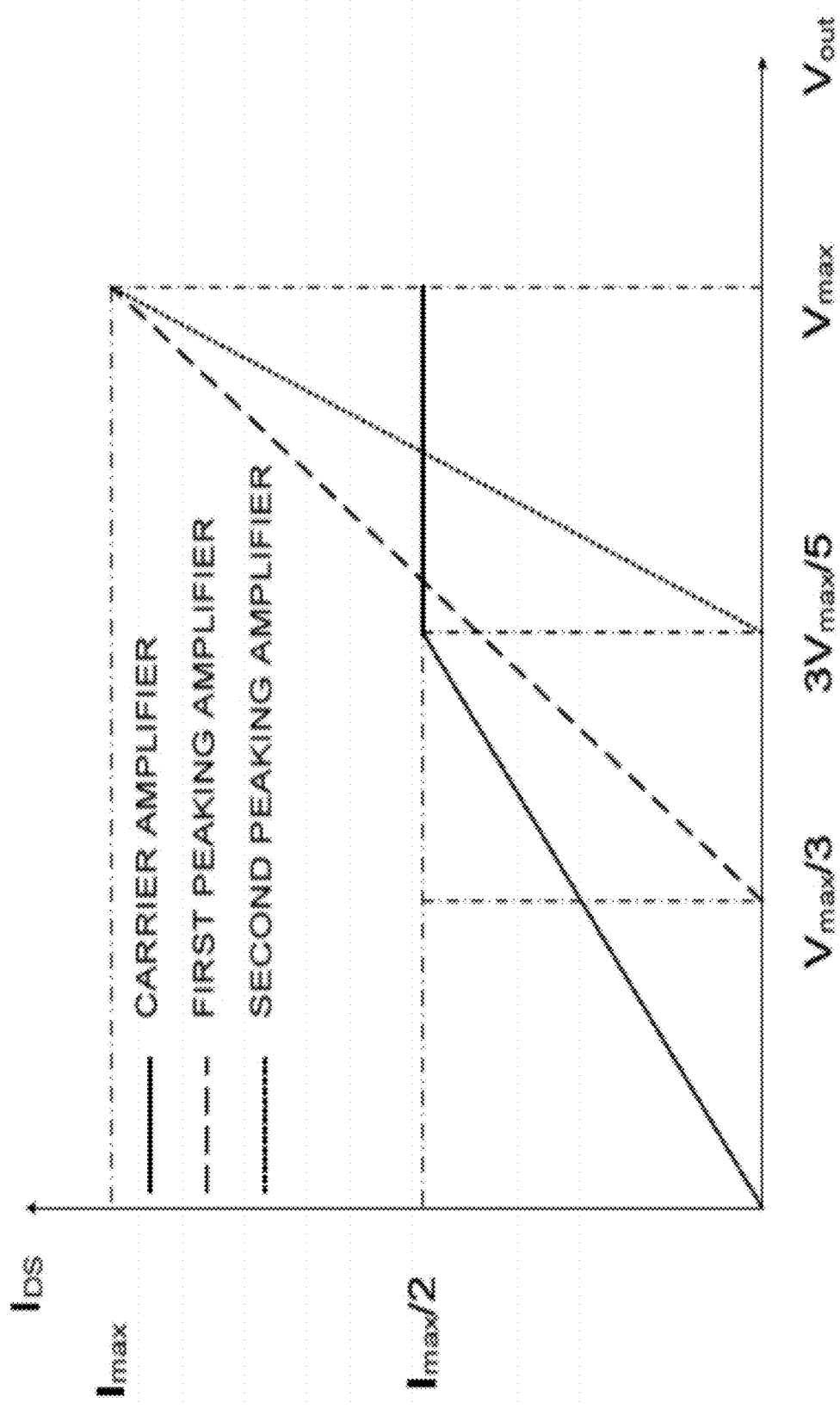
FIG. 2 is graph showing drain current characteristics of the conventional three-stage Doherty power amplifier.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
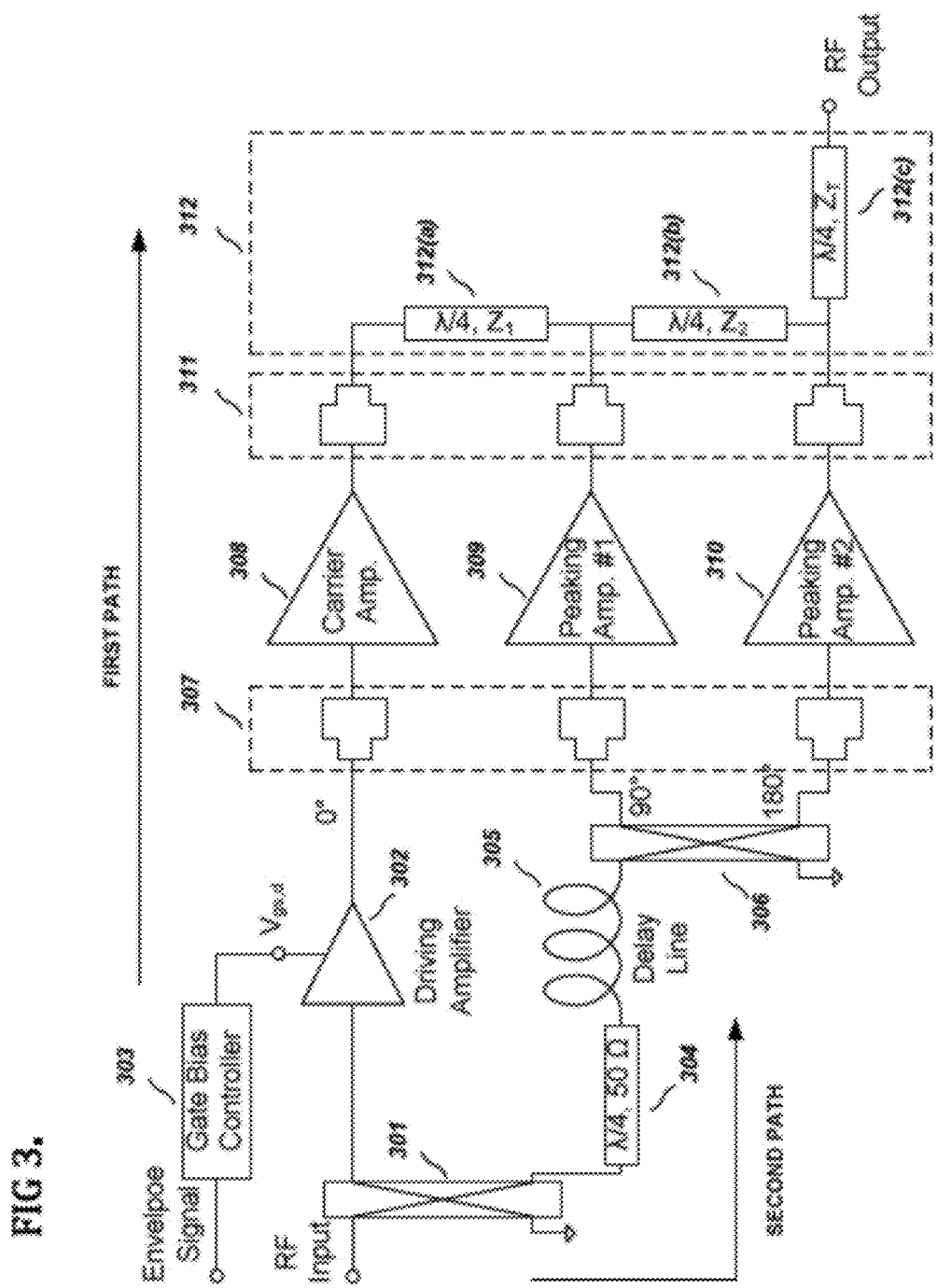
FIG. 3 is a configuration diagram of a three-stage GaN HEMT Doherty power amplifier according to an embodiment of the present invention.

FIG. 3 is a configuration diagram of a three-stage Doherty power amplifier according to an embodiment of the present invention. The three-stage Doherty power amplifier includes a 10-dB power amplifier 301, a driving amplifier 302, a gate bias controller 303, a first λ/4 transmission line 304, a delay line 305, a hybrid 3-dB power divider 306, an input matching circuit 307, a carrier amplifier 308, a first peaking amplifier 309, a second peaking amplifier 310, an output matching circuit 311, and an output λ/4 transmission line 312. The output λ/4 transmission line 312 may be divided into a second λ/4 transmission line 312a, a third λ/4 transmission line 312b, and a fourth λ/4 transmission line 312c.

In the Doherty power amplifier according to the embodiment of the present invention, the driving amplifier 302 and the gate bias controller 303 form a first path for controlling input power of the carrier amplifier 308, and the λ/4 transmission line 304, the delay line 305, the hybrid 3-dB power divider 306, the first peaking amplifier 309, and the second peaking amplifier 310 form a second path for maintaining efficiency of 40% or more in a wide output range of 40 dBm to 50 dBm.

The three-stage GaN HEMT Doherty power amplifier of FIG. 3 according to the embodiment of the present invention will be described in more detail as follows.

An input signal is used as inputs of the driving amplifier 302, the first peaking amplifier 309, and the second peaking amplifier 310 through the 10-dB power divider 301. The input power applied to the first and second peaking amplifiers 309 and 310 almost has no loss due to the 10-dB power divider 301, and the input power applied to the driving amplifier 302 is attenuated by 10 dB, compared with the source power. The input loss of the input power attenuated by 10 dB is compensated by a 10 dB gain of the driving amplifier 302, and the gain is increased more than when the existing three-way power divider is used. In order to control delay caused by the driving amplifier 302, the delay line 305 is inserted into the input of the hybrid 3-dB power divider 306. The 3-dB power divider 306 is inserted into the inputs of the first and second peaking amplifier 309 and 310 and applies inputs having the same magnitude and a phase difference of 90 degrees to the respective amplifiers. The input matching circuit 307 and the output matching circuit 311 are used at the inputs and outputs of the carrier amplifier 308 and the first and second peaking amplifiers 309 and 310, respectively, in order to optimize the gains and efficiencies. The outputs of the output matching circuits 311 of the respective amplifiers are connected to the λ/4 transmission line 312, and the second λ/4 transmission line 312a, the third λ/4 transmission line 312b, and the fourth λ/4 transmission line 312c have different impedance values depending on the capacities of elements used in the carrier amplifier 308 and the first and second peaking amplifies 308 and 309. The second to fourth λ/4 transmission lines 312a to 312c serve to increase output impedance of the carrier amplifier 308 and the first peaking amplifier 309, when the first and second peaking amplifiers 308 and 309 are not operated. Through the increase impedance, it is possible to accomplish high efficiency. In order to compensate for delay caused between the first and second peaking amplifiers 309 and 310 by the second λ/4 transmission line 312a, the first λ/4 transmission line 304 is inserted in front of the delay line 305.

When a signal having a small magnitude of 30 dBm or less is inputted, only the driving amplifier 302 and the carrier amplifier 308 are operated, but the first and second peaking amplifiers 309 and 310 are not operated, since the driving amplifier 302 and the carrier amplifier 308 are Class-AB amplifiers. As the magnitude of the input signal increases, the first and second peaking amplifiers 309 and 310 are sequentially operated, and a current is generated in a gate bias of the carrier amplifier 308. In order to remove such a current flowing in the gate bias, the input of the carrier amplifier 308 should be constantly maintained. For this operation, when an input applied to the driving amplifier 302 is 32 dBm or more, the gain of the driving amplifier 302 may be set to be reduced by 1 dB as the input is increased by 1 dB. Then, although the input is increased, the output of the driving amplifier 302 is constantly maintained. Accordingly, the input applied to the carrier amplifier 308 becomes constant. When the input of the driving amplifier 302 is 32 dBm or less, the gate voltage is constantly maintained to −3.3V. However, when the input of the driving amplifier 302 exceeds 32 dBm, the gate voltage is reduced by −0.3V whenever the input magnitude is increased by 1 dB. Then, the gain of the driving amplifier 302 is reduced. As a result, although the input is increased, the output of the driving amplifier 302, that is, the input of the carrier amplifier 308 becomes constant. Furthermore, when the gate bias voltage of the driving amplifier 302 is automatically controlled according to the magnitude of the input signal, a gate voltage of several hundreds mV is applied. However, since the gate voltage is too small for supplying a gate voltage of −3.3V or less, the gate bias controller 303 is inserted into the gate bias of the driving amplifier 302 to apply a desired voltage.

In this embodiment of the present invention, since the carrier amplifier 308, the first peaking amplifier 309, and the second peaking amplifier 310 have output powers of 15 W, 35 W, and 35 W, respectively, the impedances Z1, Z2, and ZT are set to 31.6Ω, 33.3Ω, and 70.7Ω, respectively, and the Doherty amplifier has high efficiency at about 9.5 BOP and 4.3 BOP.

Figure 4:
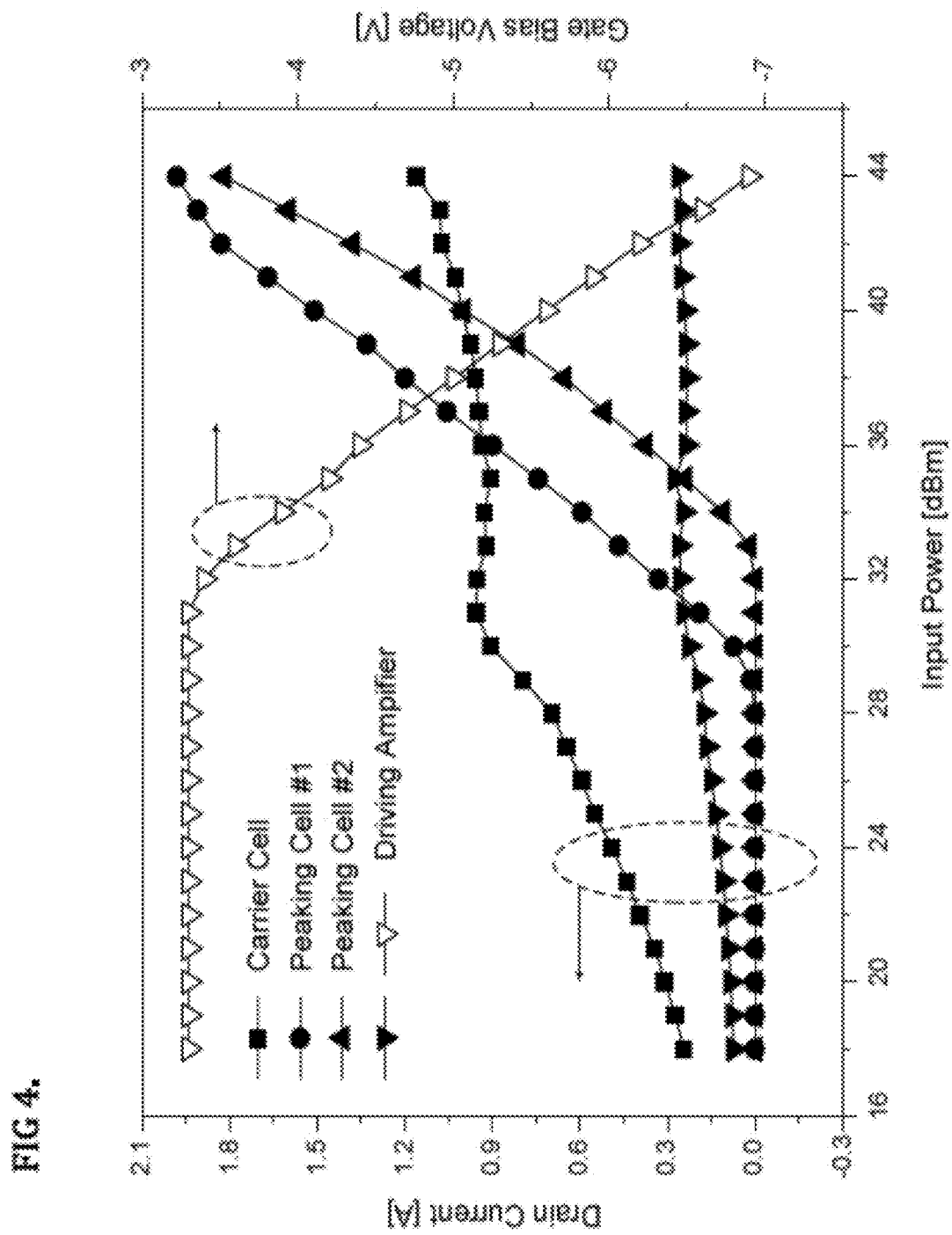
FIG. 4 is a graph showing drain current characteristics of respective amplifiers and a gate voltage of a driving amplifier based on input power, when a sine wave having a center frequency of 3.5 GHz is used as an input signal, in the Doherty amplifier of FIG. 3.

FIG. 4 is a graph showing drain current characteristics of the respective amplifiers and a gate voltage of the driving amplifier 302 based on input power, when a sine wave having a center frequency of 3.5 GHz is used as an input signal, in the Doherty amplifier of FIG. 3 according to the embodiment of the present invention. In a low input power range of 29 dBm or less, only the driving amplifier 302 and the carrier amplifier 308 are operated. Therefore, as the input power increases, the drain current of the driving amplifier 302 increases. When the input power gradually increases to 29 dBm, the first peaking amplifier 309 is operated to generate a drain current, and the second peaking amplifier 310 is also sequentially operated. At a point where the second peaking amplifier 310 starts to operate, the output of the carrier amplifier 308 is saturated, and a current starts to flow in the gate of the carrier amplifier 308. In order to prevent a current from flowing in the gate of the carrier amplifier 308, the gate bias voltage of the driving amplifier 302 is reduced. When the input power is low, the gate voltage of the driving amplifier 302 is constantly maintained to −3.3V. However, when the current starts to flow in the gate of the carrier amplifier 308, the gate voltage of the driving amplifier 302 is reduced to constantly maintain the output of the driving amplifier 302. Therefore, the input power of the carrier amplifier 308 becomes constant, and the drain current of the carrier amplifier 308 is maintained to about 1 A.

Figure 5:
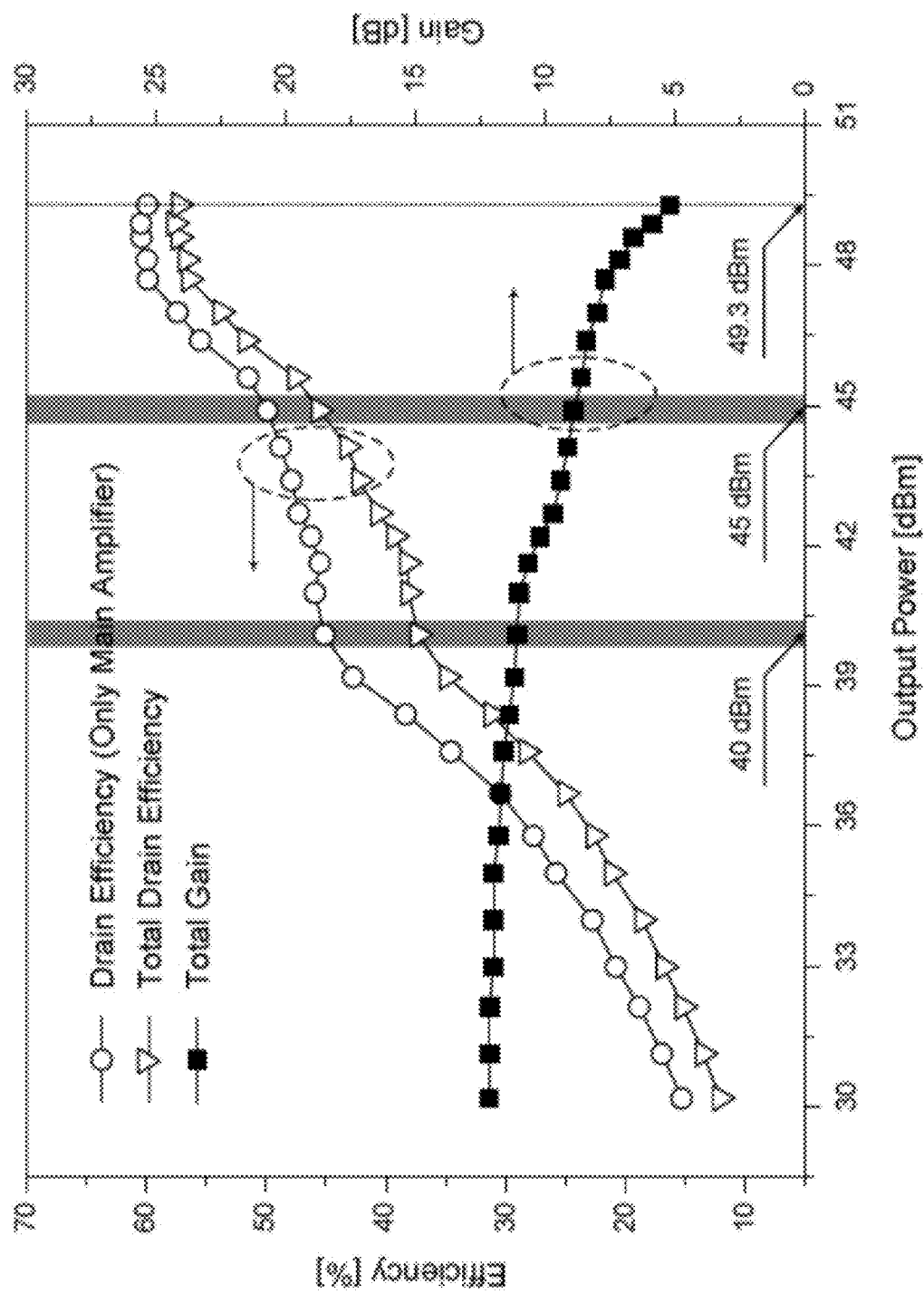
FIG. 5 shows efficiency and gain characteristics based on output power, when a sine wave having a center frequency of 3.5 GHz is used as an input signal, in the Doherty power amplifier of FIG. 3.

FIG. 5 shows efficiency and gain characteristics based on output power, when a sine wave having a center frequency of 3.5 GHz is used as an input signal, in the Doherty power amplifier of FIG. 3 according to the embodiment of the present invention. The three-stage Doherty power amplifier according to the embodiment of the present invention has a saturation power of 49.3 dBm, and exhibits high efficiency at about 40 dBm and 45 dBm. When only the carrier amplifier 308, the first peaking amplifier 309, and the second peaking amplifier 310 are considered, the Doherty power amplifier exhibits a drain efficiency of 45.1% and a gain of 11.1 dB at the output power of 40 dBm, and exhibits a drain efficiency of 49.9% and a gain of 8.9 dB at the output power of 45 dBm. When the driving amplifier 302 is included, the Doherty power amplifier exhibits drain efficiencies of 37.3% and 45.6% at the output powers of 40 dBm and 45 dBm, respectively.

Figure 6:
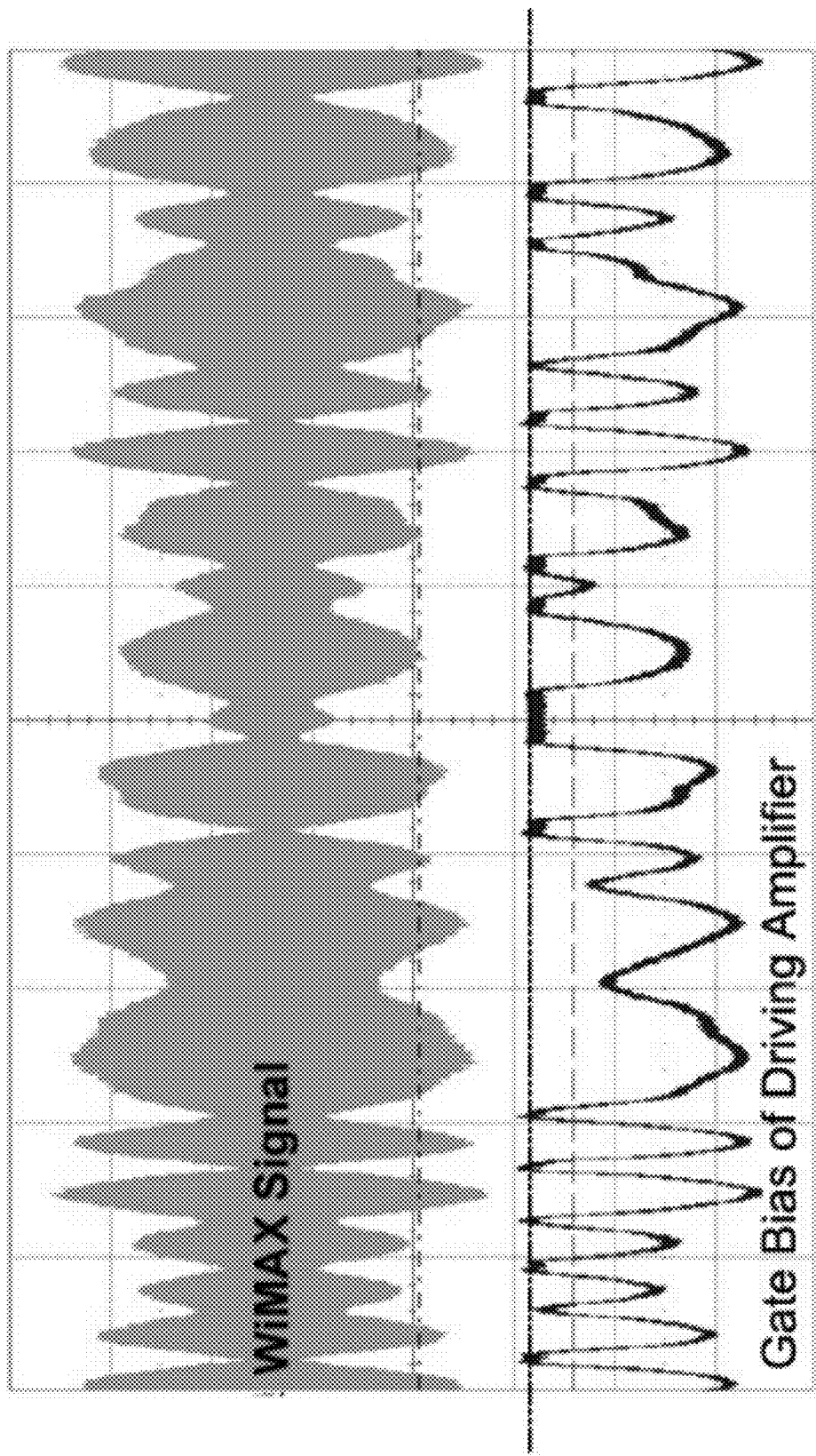
FIG. 6 is a graph showing an output of a gate bias controller when a WiMAX signal having a center frequency of 3.5 GHz and a PAPR of 8 dB is used as an input signal, in the Doherty power amplifier of FIG. 3.

FIG. 6 is a graph showing the output of the gate bias controller 303 when a WiMAX signal having a center frequency of 3.5 GHz and a PAPR of 8 dB is used as an input signal, in the Doherty power amplifier of FIG. 3 according to the embodiment of the present invention. When the magnitude of an envelope signal of the WiMAX signal increases, the magnitude of the gate bias controller 303 decreases to reduce the gain of the driving amplifier 302. When the magnitude of the envelope signal of the WiMAX signal decreases, the magnitude of the gate bias controller 303 is maintained to −3.3V.

Figure 7:
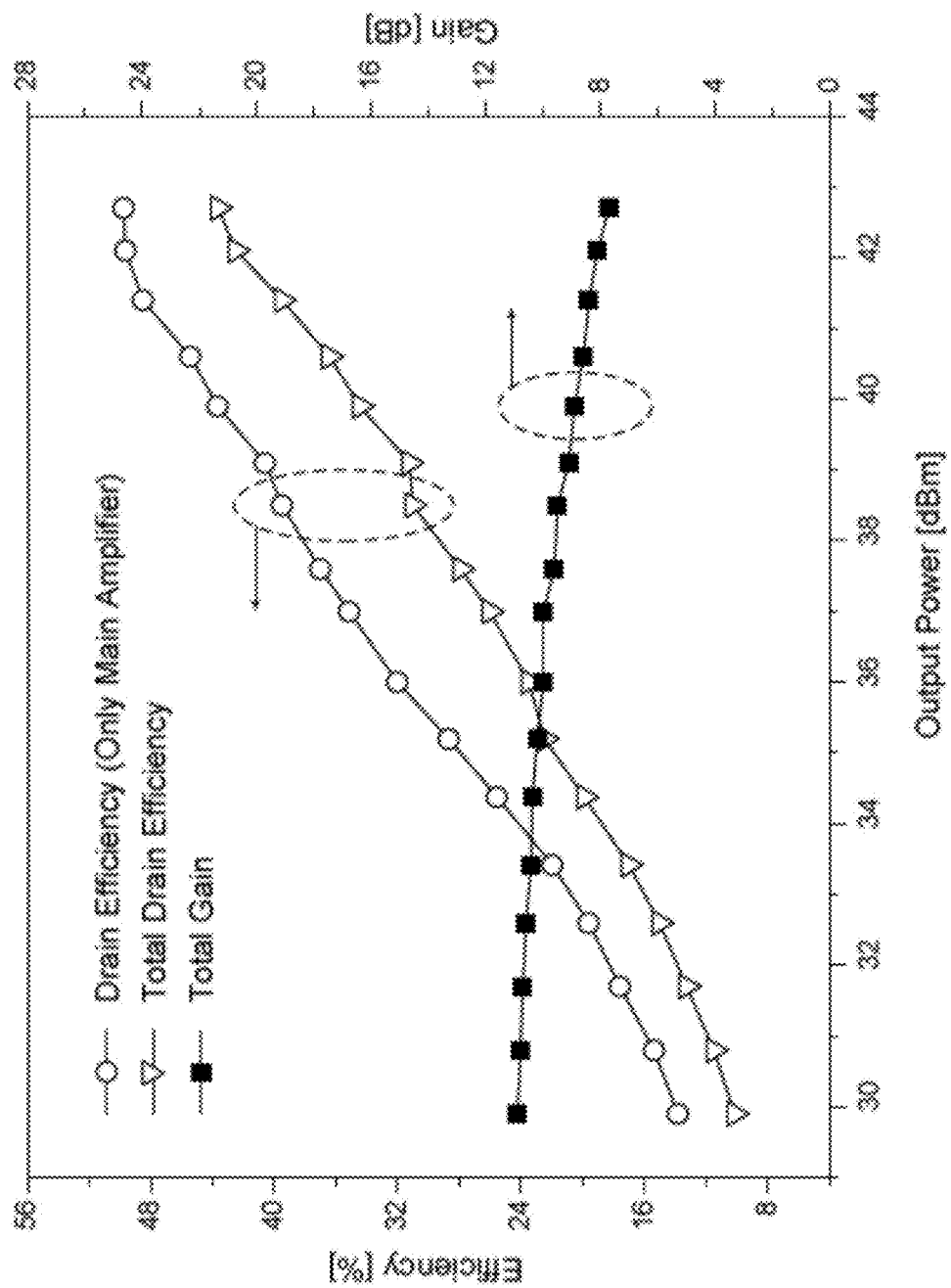
FIG. 7 is a graph showing efficiency and gain characteristics based on output power, when a WiMAX signal having a center frequency of 3.5 GHz and a PAPR of 8 dB is used as an input signal, in the Doherty power amplifier of FIG. 3.

FIG. 7 is a graph showing efficiency and gain characteristics based on output power, when a WiMAX signal having a center frequency of 3.5 GHz and a PAPR of 8 dB is used as an input signal, in the Doherty power amplifier of FIG. 3 according to the embodiment of the present invention. When only the carrier amplifier 309 and the first and second peaking amplifiers 309 and 310 are considered, the Doherty power amplifier exhibits a drain efficiency of 48.6% at an output power of 41.4 dBm corresponding to about 8 dB BOP level from the saturation output power. When the driving amplifier 302 is included, the Doherty power amplifier exhibits a drain efficiency of 39.5% and a gain of 8.4 dB.

In the Doherty power amplifier according to the embodiment of the present invention, the gain of the driving amplifier is changed according to the gate voltage, and an input applied to the carrier amplifier is maintained constantly although a high input is applied. Therefore, since a current is prevented from flowing in the gate of the carrier amplifier including a GaN HEMT, it is possible to maintain high efficiency in a wide output range.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A three-stage GaN HEMT Doherty power amplifier for high frequency applications, comprising:
   a carrier amplifier;
   first and second peaking amplifier;
   a 10-dB power divider configured to divide an input signal to the carrier amplifier and the first and second peaking amplifiers;
   a first path for controlling input power of the carrier amplifier; and
   a second path for maintaining an efficiency of 40% or more in an output range of 40 dBm to 50 dBm.

2. The three-stage GaN HEMT Doherty power amplifier of claim 1, wherein the first path comprises a driving amplifier configured to control the carrier amplifier according to the magnitude of the input signal.

3. The three-stage GaN HEMT Doherty power amplifier of claim 1, wherein the first path comprises a gate bias controller configured to amplify a voltage of several hundreds mV.

4. The three-stage GaN HEMT Doherty power amplifier of claim 1, wherein the first path comprises the carrier amplifier, and the carrier amplifier comprises a GaN HEMT.

5. The three-stage GaN HEMT Doherty power amplifier of claim 1, wherein the second path comprises a λ/4 transmission line in front of a delay line, in order to compensate for a λ/4 transmission line at an output of the carrier amplifier.

6. The three-stage GaN HEMT Doherty power amplifier of claim 1, wherein the second path comprises a hybrid 3-dB power divider configured to apply inputs having the same magnitude and a phase difference of 90 degrees to the first and second peaking amplifiers.

7. The three-stage GaN HEMT Doherty power amplifier of claim 1, wherein the second path comprises the first peaking amplifier, and the first peaking amplifier comprises a GaN HEMT.

8. The three-stage GaN HEMT Doherty power amplifier of claim 1, wherein the second path comprises the second peaking amplifier, and the second peaking amplifier comprises a GaN HEMT.

9. The three-stage GaN HEMT Doherty power amplifier of claim 1, further comprising an input matching circuit and an output matching circuit which are connected to inputs and outputs of the carrier amplifier and the first and second peaking amplifiers, respectively.

10. The three-stage GaN HEMT Doherty power amplifier of claim 9, wherein the output matching circuit is connected to an output λ/4 transmission line.

11. The three-stage GaN HEMT Doherty power amplifier of claim 10, wherein the output λ/4 transmission line has different impedance values depending on capacities of elements used in the carrier amplifier and the first and second peaking amplifiers.

* * * * *